(12) United States Patent
Liu

(10) Patent No.: US 12,513,964 B2
(45) Date of Patent: Dec. 30, 2025

(54) SHIELDED-GATE-TRENCH SEMICONDUCTOR STRUCTURE AND SHIELDED-GATE-TRENCH SEMICONDUCTOR DEVICE

(71) Applicant: SILICON-MAGIC SEMICONDUCTOR TECHNOLOGY (HANGZHOU) CO., LTD., Hangzhou (CN)

(72) Inventor: Jian Liu, Torrance, CA (US)

(73) Assignee: SILICON-MAGIC SEMICONDUCTOR TECHNOLOGY (HANGZHOU) CO., LTD., Hangzhou (CN)

( * ) Notice: Subject to any disclaimer, the term of this patent is extended or adjusted under 35 U.S.C. 154(b) by 594 days.

(21) Appl. No.: 17/946,920

(22) Filed: Sep. 16, 2022

(65) Prior Publication Data
US 2023/0112544 A1  Apr. 13, 2023

(30) Foreign Application Priority Data
Oct. 8, 2021 (CN) .......................... 202111170323.1

(51) Int. Cl.
*H10D 64/00* (2025.01)
*H10D 30/66* (2025.01)

(52) U.S. Cl.
CPC ......... *H10D 64/117* (2025.01); *H10D 30/668* (2025.01)

(58) Field of Classification Search
CPC .................................................. H10D 30/668
See application file for complete search history.

(56) References Cited

U.S. PATENT DOCUMENTS

2022/0045183 A1* 2/2022 Yang .................... H10D 62/127

* cited by examiner

*Primary Examiner* — Samuel A Gebremariam
(74) *Attorney, Agent, or Firm* — Osha Bergman Watanabe & Burton LLP

(57) ABSTRACT

An SGT semiconductor structure is provided, which includes a stack of semiconductor layers, an interlayer insulating layer, a front metal layer, and at least two contact terminals. Deep trenches are formed in the stack of semiconductor layers; an oxide layer is formed on an inner surface of each deep trench, and each deep trench is filled with a source polysilicon layer, and a gate polysilicon layer is formed in the oxide layer in the deep trench. The interlayer insulating layer is formed on the semiconductor layer and covers the top surface of the deep trenches. The front metal layer is formed on the interlayer insulating layer. The contact terminals are arranged in the interlayer insulating layer, one end of which is connected to the front metal layer, and the other end inserted into a deep trench for connecting to the corresponding source polysilicon layer; a deep trench formed without a contact terminal is between two contact terminals.

18 Claims, 3 Drawing Sheets

SHIELDED-GATE-TRENCH SEMICONDUCTOR STRUCTURE AND SHIELDED-GATE-TRENCH SEMICONDUCTOR DEVICE

FIELD OF INVENTION

The present disclosure relates to a semiconductor device, in particular to a shielded-gate-trench (SGT) semiconductor structure and an SGT semiconductor device with an increased drain-source breakdown voltage.

DESCRIPTION OF THE RELATED ARTS

SGT metal-oxide-semiconductor field-effect transistors (MOSFETs) have advantages such as high power density and low switching losses so as to be widely used in power devices. Compared to conventional trench MOSFETs, existing SGT semiconductor devices have a relatively lower risk of drain-source breakdown. However, when a higher breakdown voltage is required of the devices, the depth of trenches and thickness of epitaxial layer will be increased to withstand higher electric field. Therefore, in order to increase the drain-to-source breakdown voltage of the conventional SGT semiconductor devices, the manufacturing process and design must be substantially changed, which increases the device cost.

SUMMARY

The technical problem to be solved by the present disclosure is to increase the drain-source breakdown voltage and make the devices more stable with a broader operating range. The present disclosure provides an SGT semiconductor structure, which includes a stack of semiconductor layers, an interlayer insulating layer, a front metal layer and at least two contact terminals. The stack of semiconductor layers include a plurality of deep trenches, wherein the plurality of deep trenches is parallel to each other; an oxide layer, formed on an inner surface of each of the plurality of deep trenches; a source polysilicon layer, disposed into each of the plurality of deep trenches next to the oxide layer; and a gate polysilicon layer, wherein the gate polysilicon layer is disposed in a top portion of the oxide layer in each of the plurality of deep trenches. The interlayer insulating layer is formed on the stack of semiconductor layers and covering a top surface of the gate polysilicon layer, a top surface of the oxide layer, and a top surface of the source polysilicon layer in each of the plurality of deep trenches. The front metal layer is formed on the interlayer insulating layer. Each of the two contact terminals is formed in the interlayer insulating layer and the source polysilicon layer in one of the plurality of deep trenches, wherein an top end of each of the two contact terminals is electrically connected to the front metal layer, and a bottom end of each of the two contact terminals is inserted into and electrically connected to the source polysilicon layer.

Optionally, the stack of semiconductor layers further includes: a semiconductor substrate layer, which is of a first dopant type; a first semiconductor layer formed on the semiconductor substrate layer, wherein the first semiconductor layer is of the first dopant type; and a second semiconductor layer formed on the first semiconductor layer, wherein the second semiconductor layer is of a second dopant type.

Optionally, a dopant concentration of the first semiconductor layer is lower than a dopant concentration of the semiconductor substrate layer.

Optionally, the plurality of deep trenches extends from within the semiconductor substrate layer, and penetrates through the first semiconductor layer and the second semiconductor layer.

Optionally, the interlayer insulating layer is formed on the second semiconductor layer.

Optionally, the SGT semiconductor structure further includes a back metal layer, and the semiconductor substrate layer is formed on the back metal layer.

The present disclosure also provides a SGT semiconductor device, comprising the SGT semiconductor structure as previously disclosed, wherein the SGT semiconductor structure is divided into a source region and a gate region, at least three deep trenches of the plurality of deep trenches are located in the source region, and at least one deep trench of the plurality of trenches is located in the gate region; wherein the front metal layer comprises a source metal layer and a gate metal layer, wherein the source metal layer is located in the source region, the gate metal layer is located in the gate region, wherein the source metal layer and the gate metal layer are located above the interlayer insulating layer and are spaced apart from each other; wherein the two contact terminals comprise two source contact terminals and two gate contact terminals, wherein the two source contact terminals comprise a first source contact terminal and a second source contact terminal located in the source region, and wherein the gate contact terminals are located in the gate region; wherein one end of each of the source contact terminals is connected to the source metal layer, another end of each of the source contact terminals is disposed into one of the at least three deep trenches in the source region for connecting to the source polysilicon layer of a corresponding deep trench; wherein one of the at least three deep trenches in the source region is formed without a contact terminal, and is positioned between the first source contact terminal and the second source contact terminal; and wherein the two gate contact terminals are disposed into one of the plurality of deep trenches in the gate region, and are respectively connected to the gate polysilicon layer of the corresponding one of the plurality of deep trenches.

Optionally, the SGT semiconductor device further includes a third source contact terminal, wherein the third source contact terminal is disposed into both the first semiconductor layer and the second semiconductor layer, between two adjacent deep trenches of the at least three deep trenches of the plurality of deep trenches in the source region, and wherein the third source contact terminal is connected to the source metal layer, the first semiconductor layer, and the second semiconductor layer.

The beneficial effects of the present disclosure include: by arranging the plurality of contact terminals in the source region to connect to the source polysilicon layers, the potential of the source polysilicon layers is changed, thereby increasing the drain-source breakdown voltage, and thus mitigating the risk of drain-source breakdown, so as to improve the device's reliability and widen its operating range.

The above description is merely an overview of the technical solution of the present disclosure. In order to understand the technical means of the present disclosure more clearly and implement it according to the content of the specification, the present disclosure will be described in detail below with reference to the preferred embodiments of the present disclosure and the accompanying drawings.

DETAILED DESCRIPTION

The present disclosure is described below by specific embodiments, and those skilled in the art can readily understand other advantages and functions of the present disclosure from the description herein.

It should be noted that the embodiments in the present disclosure and features in the embodiments may be combined with each other if no conflicts will result. In order to make those skilled in the art better understand the solutions of the present disclosure, the technical solutions in the embodiments of the present disclosure will be clearly and completely described below with reference to the accompanying drawings of the embodiments of the present disclosure. The described embodiments are merely a portion of all potential embodiments of the present disclosures. All other embodiments obtained by persons of ordinary skill in the art based on the described embodiments of the present disclosure without creative efforts shall fall within the scope by the present disclosure.

It should be noted that the terms "first", "second" and the like in the description, claims, and the drawings of the present disclosure may be used to distinguish similar objects, and are not necessarily used to describe a specific sequence or order. In addition, the terms "comprising" and "including" and any variations thereof, are intended to cover non-exclusive inclusion; for example, processes, methods, systems, products or devices are not limited to the steps or units which are distinctly listed, and may include other steps or units which are not distinctly listed or inherent to these processes, methods, products or devices.

It should be noted that, unless particularly specified, the terms "installed," "connected," and "coupled" should be understood in a broad sense; for example, the corresponding connection may be a fixed connection, a detachable connection, or an integral connection; it can be a mechanical connection or an electrical connection; it can be a direct connection, an indirect connection through an intermediate medium, or an internal connection between two components. For those of ordinary skill in the art, the specific meanings of the above terms in the present disclosure can be understood in specific situations.

Figure 1:
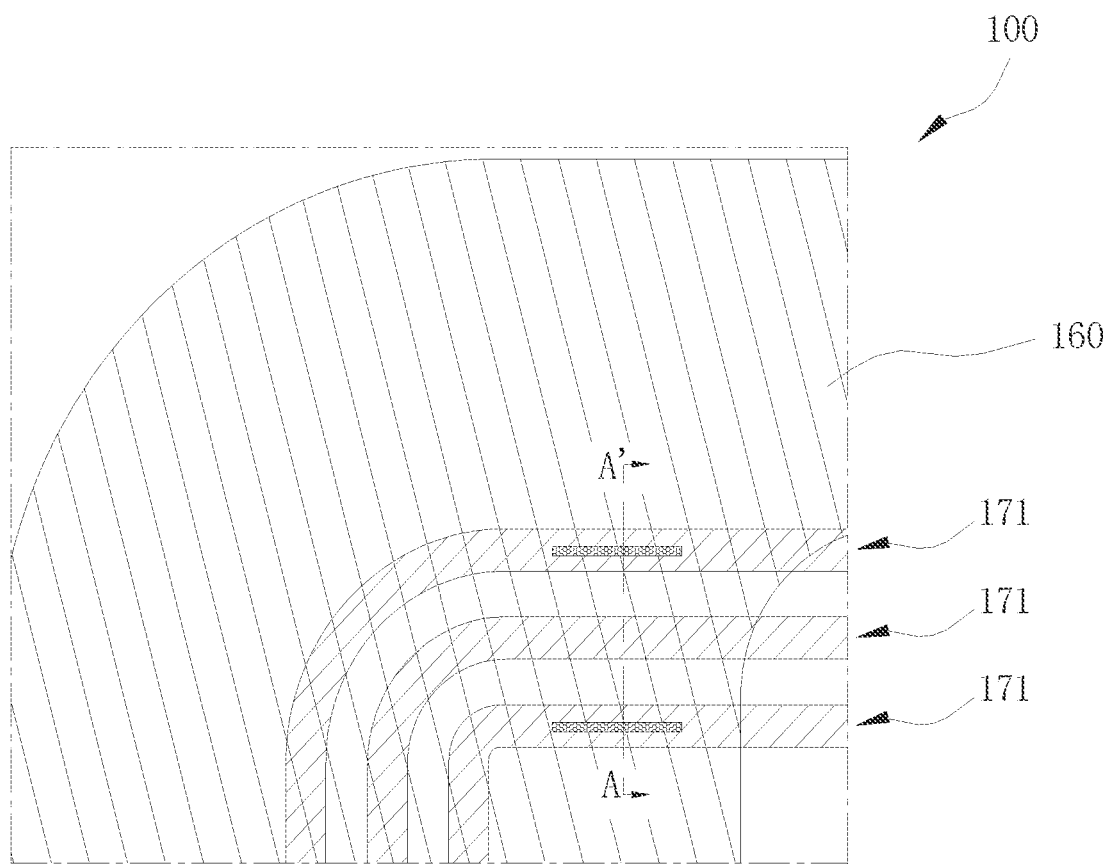
FIG. 1 is a top view of an SGT semiconductor structure according to an embodiment of the present disclosure.
Figure 2:
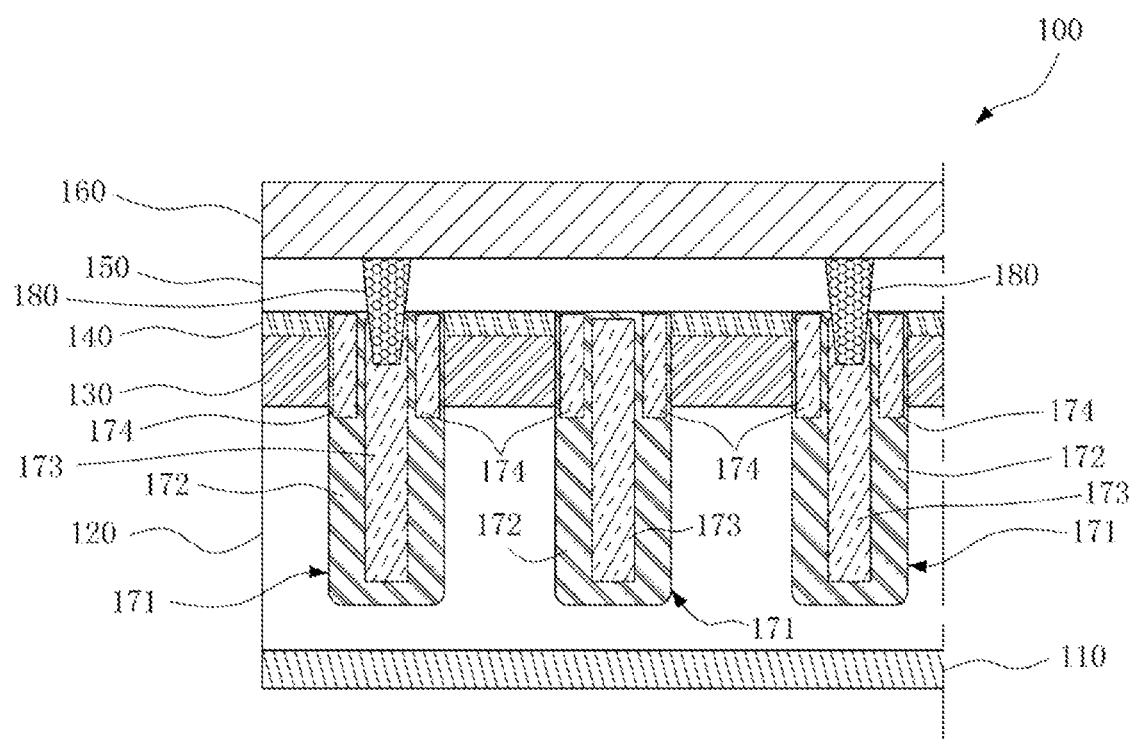
FIG. 2 is a cross-sectional view of the SGT semiconductor structure of FIG. 1 with the cutting plane passing through the line AA' according to the first embodiment of the present disclosure.

FIG. 1 and FIG. 2 show a SGT semiconductor structure 100 according to an embodiment of the present disclosure. The SGT semiconductor structure can be part of a power device with a high drain-to-source breakdown voltage.

As shown in FIG. 1 and FIG. 2, the SGT semiconductor structure 100 includes, from bottom up, a back metal layer 110, a semiconductor substrate layer 120, a first semiconductor layer 130, a second semiconductor layer 140, an interlayer insulating layer 150, a front metal layer 160, and at least two contact terminals 180.

As shown in FIG. 2, the semiconductor substrate layer 120 is formed on the back metal layer 110, and is of a first dopant type, such as N-type heavy doping (N+). The first semiconductor layer 130 and the second semiconductor layer 140 are formed over the semiconductor substrate layer 120. The second semiconductor layer 140 is over the first semiconductor layer 130. Accordingly, the semiconductor substrate layer 120, the first semiconductor layer 130 and the second semiconductor layer 140 constitute a stack of semiconductor layers formed on the back metal layer 110. The first semiconductor layer 130 is of the first dopant type. The dopant concentration of the first semiconductor layer 130 is lower than the dopant concentration of the semiconductor substrate layer 120. For example, the first semiconductor layer 130 may be formed by an epitaxial process on the semiconductor substrate layer 120 so that the dopant concentration of the first semiconductor layer 130 is lower than the dopant concentration of the semiconductor substrate layer 120; or the first semiconductor layer 130 may be lightly doped with the first dopant type by ion implantation so that the dopant concentration of the first semiconductor layer 130 is lower than that of the semiconductor substrate layer 120. Conversely, the second semiconductor layer 140 is of the second dopant type, such as P-type dopant. Specifically, through the above-mentioned doping configuration, the first semiconductor layer 130 and the second semiconductor layer 140 can be respectively used as a well region and a source region. The aforementioned doping configuration is just an example, and can be changed to adopt other doping or ion implantation methods as long as a well region and a source region that are functional are obtained.

As shown in FIG. 1, a plurality of parallel deep trenches 171 is formed in semiconductor layer. Specifically, the number of the deep trenches 171 is at least three. The deep trenches 171 extend into the semiconductor substrate layer 120, that is, deep trenches 171 penetrate the first semiconductor layer 130 and the second semiconductor layer 140 so that openings of the deep trenches 171 are not covered by the first semiconductor layer 130 and the second semiconductor layer 140. In other words, as shown in FIG. 1, the deep trenches 171 cut the semiconductor substrate layer 120, the first semiconductor layer 130 and the second semiconductor layer 140 into a plurality of blocks in a top view. In addition, the deep trenches 171 extend toward the back metal layer 110 in the depth direction. In an example, the back metal layer 110 is configured to be a drain of the semiconductor device, and the front metal layer 160 is configured to be a corresponding source.

As shown in FIG. 2, an oxide layer 172 is formed on an inner surface of each of the deep trenches 171, and a source polysilicon layer 173 is disposed into each of the plurality of deep trenches 171 next to the oxide layer. A gate polysilicon layer 174, is disposed in a top portion of the oxide layer 172 in each of the plurality of deep trenches 171. The source polysilicon layer 173 and the gate polysilicon layers 174 are substantially covered by the oxide layer 172, and the source polysilicon layer 173 forms a shielded gate.

As shown in FIG. 2, the interlayer insulating layer 150 is formed on the second semiconductor layer 140 and covers the deep trenches 171, and the front metal layer 160 is formed on the interlayer insulating layer 150. At least two contact terminals 180 are arranged in the interlayer insulating layer 150. One end of each of the contact terminals 180 is connected to the front metal layer 160, and the other end of each of the contact terminals 180 penetrates the interlayer insulating layer 150 and is inserted into a corresponding deep trench 171 for connecting to the source polysilicon layer 173 of the deep trench. In an example, the number of the at least two contact terminals 180 is two, and the two deep trenches 171 into which the two contact terminals 180 are inserted are not directly adjacent to each other, and a deep trench 171 formed without a contact terminal is formed between the two contact terminals 180.

The present disclosure introduces the contact terminals 180 into the SGT semiconductor device, as a result, the potential of the source polysilicon layers 173 is changed to increase the drain-source breakdown voltage of the SGT semiconductor structure 100, thereby mitigating of risk of drain-source breakdown.

Figure 3:
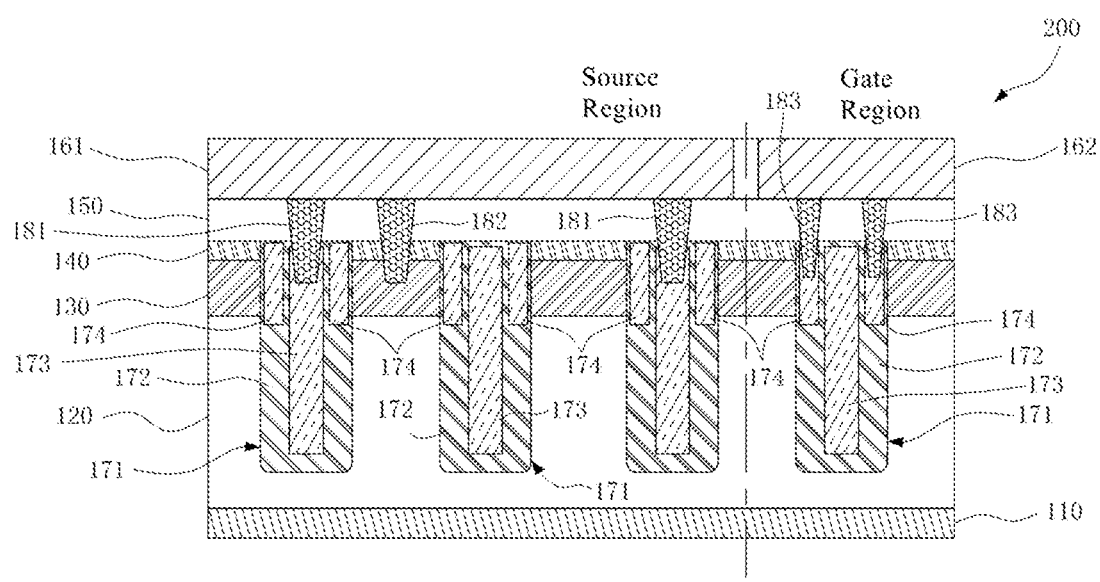
FIG. 3 is a cross-sectional view of another SGT semiconductor device according to the second embodiment of the present disclosure.

As shown in FIG. 3, a second embodiment of the present disclosure discloses a SGT semiconductor device 200. In one example, the SGT semiconductor device 200, includes the SGT semiconductor structure 100 described above.

As shown in FIG. 3, the SGT semiconductor device 200 includes, from bottom up, a back metal layer 110, a semiconductor substrate layer 120, a first semiconductor layer 130, a second semiconductor layer 140, an interlayer insulating layer 150, a source metal layer 161, a gate metal layer 162, source contact terminals 181, 182, and gate contact terminals 183.

As shown in FIG. 3, the SGT semiconductor device 200 is divided into a source region and a gate region; the semiconductor substrate layer 120 is formed on the back metal layer 110. The first semiconductor layer 130 is formed on the semiconductor substrate layer 120, and the second semiconductor layer 140 is formed on the first semiconductor layer 130, thereby forming a stack of semiconductor layers. The doping configurations of the semiconductor substrate layer 120, the first semiconductor layer 130 and the second semiconductor layer 140 are substantially the same as those of the first embodiment.

As shown in FIG. 3, a plurality of deep trenches 171 is formed in the stack of the semiconductor layers, and the deep trenches 171 are parallel to each other. Some of the deep trenches 171 are located in the source region, the other in the gate region. Specifically, in an example, three of the plurality of deep trenches 171 are arranged in the source region while one of the plurality of deep trenches 171 is arranged in the gate region. Similarly, the plurality of deep trenches 171 penetrates the first semiconductor layer 130 and the second semiconductor layer 140, so that openings of the plurality of deep trenches 171 are not covered by the first semiconductor layer 130 and the second semiconductor layer 140. Specifically, the back metal layer 110 is to be a drain of the semiconductor device.

As shown in FIG. 3, an oxide layer 172 is formed on an inner surface of each of the deep trenches 171, and each of the deep trenches 171 is filled with a source polysilicon layer 173 extending along the depth direction and gate polysilicon layers 174 on both sides of the source polysilicon layer 173. The interlayer insulating layer 150 is formed on the second semiconductor layer 140 and covers the deep trenches 171. The source metal layer 161 and the gate metal layer 162 are formed on the interlayer insulating layer 150, and together form the front metal layer 160 as illustrated in the first embodiment. The source metal layer 161 is located in the source region, the gate metal layer 162 is located in the gate region, and the source metal layer 161 and the gate metal layer 162 are disposed on the interlayer insulating layer 150 with no direct electrical connection between the metal layers 161, 162.

As shown in FIG. 3, the source contact terminals 181, 182 and the gate contact terminals 183 are disposed in the interlayer insulating layer 150, wherein the source contact terminals 181, 182 are located in the source region, and the gate contact terminals 183 are located in the gate region. The source contact terminals 181, 182 include a first set of source contact terminals 181, and a second set of source contact terminals 182. The first set of source contact terminals 181 includes at least two source contact terminals, i.e., a first source contact terminal and a second source contact terminal, one end of each of the first set of source contact terminals 181 is connected to the source metal layer 161, and the other end of each of the first set of source contact terminals 181 penetrates the interlayer insulating layer 150 and is inserted into one of the deep trenches 171 for connecting to the corresponding source polysilicon layer 173. In an example, the second set of source contact terminals 182 includes a third source contact terminal 182. As an example, the SGT semiconductor device 200 includes four deep trenches 171, one in the gate region, three in the source region; the three deep trenches in the source region are a first deep trench, a second deep trench, and a third deep trench, among which, the third deep trench is the one closest to the gate region, and the first deep trench is the one furthest from the gate region; the one in the gate region is referred to as a fourth deep trench. The first and second source contact terminals 181 are inserted into the first and third deep trenches respectively. Accordingly, the source polysilicon layers 173 to which the first and second source contact terminals 181 are connected are not directly adjacent to each other, and instead the second deep trench formed with no contact terminal is positioned between the first and second source contact terminals 181. The third source contact terminal 182 is inserted into the first semiconductor layer 130 and the second semiconductor layer 140 between two adjacent deep trenches of the three deep trenches in the source region to connect the source metal layer 161, the first semiconductor layer 130, and the second semiconductor layer 140. There are at least two gate contact terminals 183. In an example, there are two gate contact terminals 183, and they are inserted into the fourth deep trench, and are respectively connected to the two corresponding gate polysilicon layers 174 of the fourth deep trench.

By arranging a plurality of contact terminals 180 and 181 in the source region to connect the source polysilicon layers 173, the potential of the source polysilicon layers 173 is changed to increase the drain-source breakdown voltage, and the risk of drain-source breakdown is mitigated, so as to improve the device's reliability and widen its operating range. In addition, for manufacturing the contact terminals 180 and 181, no additional photomasks are need, and instead, the ones for fabricating conventional SGT semiconductor devices can still be used after some minor modifications relating to the contact terminals 180, 181. Therefore, the present disclosure does not increase the complexity of the process for fabricating semiconductor SGT devices.

The above description is merely a description of the preferred embodiments of the present disclosure, and is not intended to limit the scope of the present disclosure. Any change or modification made by those of ordinary skill in the field of the present disclosure based on the above disclosure should still fall within the scope of the appended claims.

The invention claimed is:

1. A shielded-gate-trench (SGT) semiconductor structure, comprising:
    a stack of semiconductor layers, comprising:
        a plurality of deep trenches, wherein the plurality of deep trenches are parallel to each other;
        an oxide layer, formed on an inner surface of each of the plurality of deep trenches;
        a source polysilicon layer, disposed into each of the plurality of deep trenches next to the oxide layer; and a gate polysilicon layer, wherein the gate polysilicon layer is disposed in a top portion of the oxide layer in each of the plurality of deep trenches;

an interlayer insulating layer, formed on the stack of semiconductor layers and covering a top surface of the gate polysilicon layer, a top surface of the oxide layer, and a top surface of the source polysilicon layer in each of the plurality of deep trenches;

a front metal layer, formed on the interlayer insulating layer; and a plurality of contact terminals, each formed in the interlayer insulating layer and the source polysilicon layer in one of the plurality of deep trenches, wherein a top end of each of the contact terminals is electrically connected to the front metal layer, and a bottom end of each of the contact terminals is inserted into and electrically connected to the source polysilicon layer, wherein the SGT semiconductor structure is divided into a source region and a gate region, and one of the deep trenches is formed without contact terminal, and is positioned between two of the contact terminals in the source region.

2. The SGT semiconductor structure according to claim 1, wherein the stack of semiconductor layers further comprises:

a semiconductor substrate layer, which is of a first dopant type;

a first semiconductor layer, which is of the first dopant type, formed on the semiconductor substrate layer; and a second semiconductor layer, which is of a second dopant type, formed on the first semiconductor layer.

3. The SGT semiconductor structure according to claim 2, wherein a dopant concentration of the first semiconductor layer is smaller than a dopant concentration of the semiconductor substrate layer.

4. The SGT semiconductor structure according to claim 2, wherein the plurality of deep trenches extends from within the semiconductor substrate layer, penetrates through the first semiconductor layer and ends at the second semiconductor layer.

5. The SGT semiconductor structure according to claim 2, wherein the interlayer insulating layer is formed on the second semiconductor layer.

6. The SGT semiconductor structure according to claim 2, further comprising a back metal layer, wherein the semiconductor substrate layer is formed on the back metal layer.

7. A SGT semiconductor device, comprising the SGT semiconductor structure according to claim 1, wherein at least three deep trenches of the plurality of deep trenches are located in the source region, and at least one deep trench of the plurality of trenches is located in the gate region;

wherein the front metal layer comprises a source metal layer and a gate metal layer, wherein the source metal layer is located in the source region, the gate metal layer is located in the gate region, wherein the source metal layer and the gate metal layer are located above the interlayer insulating layer and are spaced apart from each other;

wherein the plurality of contact terminals comprise two source contact terminals and two gate contact terminals, wherein the two source contact terminals comprise a first source contact terminal and a second source contact terminal located in the source region, and wherein the gate contact terminals are located in the gate region; wherein one end of each of the source contact terminals is connected to the source metal layer, another end of each of the source contact terminals is disposed into one of the at least three deep trenches in the source region for connecting to the source polysilicon layer of a corresponding deep trench; and wherein the two gate contact terminals are disposed into one of the plurality of deep trenches in the gate region, and are respectively connected to the gate polysilicon layer of the corresponding one of the plurality of deep trenches.

8. The SGT semiconductor device according to claim 7, further comprising a third source contact terminal, wherein the third source contact terminal is disposed into both the first semiconductor layer and the second semiconductor layer, between two adjacent deep trenches of the at least three deep trenches of the plurality of deep trenches in the source region, and wherein the third source contact terminal is connected to the source metal layer, the first semiconductor layer, and the second semiconductor layer.

9. A shielded-gate-trench (SGT) semiconductor structure, comprising:

a stack of semiconductor layers, comprising:

a plurality of deep trenches, wherein the plurality of deep trenches are parallel to each other;

an oxide layer, formed on an inner surface of each of the plurality of deep trenches;

a source polysilicon layer, disposed into each of the plurality of deep trenches next to the oxide layer; and a gate polysilicon layer, wherein the gate polysilicon layer is disposed in a top portion of the oxide layer in each of the plurality of deep trenches;

an interlayer insulating layer, formed on the stack of semiconductor layers;

a front metal layer, formed on the interlayer insulating layer; and a plurality of contact terminals, each formed in the interlayer insulating layer and the source polysilicon layer in one of the plurality of deep trenches, wherein the SGT semiconductor structure is divided into a source region and a gate region, and one of the deep trenches is formed without contact terminal, and is positioned between two of the contact terminals in the source region.

10. The SGT semiconductor structure according to claim 9, wherein the stack of semiconductor layers further comprises:

a semiconductor substrate layer, which is of a first dopant type;

a first semiconductor layer, which is of the first dopant type, formed on the semiconductor substrate layer; and a second semiconductor layer, which is of a second dopant type, formed on the first semiconductor layer.

11. The SGT semiconductor structure according to claim 10, wherein a dopant concentration of the first semiconductor layer is smaller than a dopant concentration of the semiconductor substrate layer.

12. The SGT semiconductor structure according to claim 10, wherein the plurality of deep trenches extends from within the semiconductor substrate layer, penetrates through the first semiconductor layer and ends at the second semiconductor layer.

13. The SGT semiconductor structure according to claim 10, wherein the interlayer insulating layer is formed on the second semiconductor layer.

14. The SGT semiconductor structure according to claim 10, further comprising a back metal layer, wherein the semiconductor substrate layer is formed on the back metal layer.

15. A SGT semiconductor device, comprising the SGT semiconductor structure according to claim 9,
wherein the SGT semiconductor structure is divided into a source region and a gate region, at least three deep trenches of the plurality of deep trenches are located in the source region, and at least one deep trench of the plurality of trenches is located in the gate region;
wherein the front metal layer comprises a source metal layer and a gate metal layer, wherein the source metal layer is located in the source region, the gate metal layer is located in the gate region, wherein the source metal layer and the gate metal layer are located above the interlayer insulating layer and are spaced apart from each other;
wherein the two contact terminals comprise two source contact terminals and two gate contact terminals, wherein the two source contact terminals comprise a first source contact terminal and a second source contact terminal located in the source region, and wherein the gate contact terminals are located in the gate region; wherein one end of each of the source contact terminals is connected to the source metal layer, another end of each of the source contact terminals is disposed into one of the at least three deep trenches in the source region for connecting to the source polysilicon layer of a corresponding deep trench; wherein one of the at least three deep trenches in the source region is formed without a contact terminal, and is positioned between the first source contact terminal and the second source contact terminal; and
wherein the two gate contact terminals are disposed into one of the plurality of deep trenches in the gate region, and are respectively connected to the gate polysilicon layer of the corresponding one of the plurality of deep trenches.

16. The SGT semiconductor device according to claim 15, further comprising a third source contact terminal, wherein the third source contact terminal is disposed into both the first semiconductor layer and the second semiconductor layer, between two adjacent deep trenches of the at least three deep trenches of the plurality of deep trenches in the source region, and wherein the third source contact terminal is connected to the source metal layer, the first semiconductor layer, and the second semiconductor layer.

17. The SGT semiconductor structure according to claim 9, wherein the interlayer insulating layer covers a top surface of the gate polysilicon layer, a top surface of the oxide layer, and a top surface of the source polysilicon layer in each of the plurality of deep trenches.

18. The SGT semiconductor structure according to claim 9, wherein a top end of each of the contact terminals is electrically connected to the front metal layer, and a bottom end of each of the contact terminals is inserted into and electrically connected to the source polysilicon layer.

* * * * *